United States Patent [19]

Dickson et al.

[11] 4,129,794
[45] Dec. 12, 1978

[54] ELECTRICAL INTEGRATED CIRCUIT CHIPS

[75] Inventors: John F. Dickson; John D. Wilcock, both of Northampton, England

[73] Assignee: Plessey Handel und Investments AG, Zug, Switzerland

[21] Appl. No.: 720,235

[22] Filed: Sep. 3, 1976
(Under 37 CFR 1.47)

[30] Foreign Application Priority Data

Sep. 4, 1975 [GB] United Kingdom ............... 36458/75
Nov. 22, 1975 [GB] United Kingdom ............... 48099/75

[51] Int. Cl.² .................... H03K 17/60; H03K 17/10
[52] U.S. Cl. ................................. 307/270; 307/208; 307/251; 307/DIG. 1; 307/DIG. 4
[58] Field of Search ............... 307/205, 208, 246, 251, 307/264, 270, DIG. 1, DIG. 4

[56] References Cited

U.S. PATENT DOCUMENTS

| 3,506,851 | 4/1970 | Polkinghorn et al. | 307/251 |
| 3,662,188 | 5/1972 | Williams | 307/DIG. 1 X |
| 3,675,043 | 7/1972 | Bell | 307/DIG. 1 X |
| 3,806,880 | 4/1974 | Spence | 307/205 X |
| 3,835,457 | 9/1974 | Yu | 307/DIG. 1 X |
| 3,872,321 | 3/1975 | Matsue | 307/205 |
| 3,898,479 | 8/1975 | Proebsting | 307/DIG. 4 X |
| 3,925,689 | 12/1975 | Rubenstein | 307/DIG. 1 X |
| 3,938,108 | 2/1976 | Salsbury | 307/DIG. 4 X |
| 3,959,781 | 5/1976 | Mehta et al. | 307/DIG. 1 X |

FOREIGN PATENT DOCUMENTS 2340770  2/1975  Fed. Rep. of Germany .... 307/DIG. 4

Primary Examiner—Larry N. Anagnos
Attorney, Agent, or Firm—Fleit & Jacobson

[57] ABSTRACT

An MOST buffer circuit has a first normally non-conductive transistor in series with a second normally conductive transistor between earth and a main power supply. A normally discharged bootstrap capacitor is connected between the common connection point of the two transistors and the gate of the first transistor. In response to an input signal, the transistor is switched on, the transistors conduct in series, and the bootstrap capacitor charges. The transistor is then switched off, ceasing the series current and developing an output potential which approximates to that of the power supply.

12 Claims, 4 Drawing Figures

ELECTRICAL INTEGRATED CIRCUIT CHIPS

This invention relates to electrical integrated circuit chips and relates more specifically to such chips incorporating so-called buffer circuits.

Electrical integrated circuit buffer circuits are known and usually fall into two types. A first type makes use of complementary transistors and enables a voltage swing of an output signal to be substantially the same as the voltage swing on an input signal and a second type makes use of transistors of the same type which either afford an output signal the voltage swing of which equals or is greater than an input voltage swing but which necessitates drawing current continuously from a power supply or alternatively afford an output voltage the voltage swing of which is less than that of the input voltage.

It is an object of the present invention to provide an electrical integrated current chip which includes a buffer circuit which enables an output voltage the swing of which is at least as great as that of an input signal to be generated whilst consuming no or negligible continuous power and which does not necessitate the use of complementary transistors.

According to the present invention there is provided an electrical integrated circuit chip which includes a buffer circuit comprising first and second insulated gate field effect transistors of the same channel conductivity type which are connected in series between power supply terminals, the junction of said transistors affording an output of said circuit, means for causing the first and second transistors to be operated in antiphase in response to an input signal applied to said circuit so that one of said transistors operates in source follower configuration and bootstrap capacitor means connected to the transistor operating in source-follower configuration for causing the voltage swing of an output voltage afforded by said output to at least equal the voltage swing of an input signal applied to said circuit.

By arranging that the first and second transistors are operated in antiphase, power is only consumed by said transistors during transitions.

In carrying out the invention using negative logic, the first transistor may be arranged to be normally non-conductive and may be connected to operate in source-follower configuration, and the second transistor may be arranged to be normally conductive, the bootstrap capacitor being connected between the junction of the first and second transistors and the gate electrode of the first transistor.

In one form of chip according to the present invention, the buffer circuit may include inverter means to which the input signal to the circuit is applied, the output of the inverter means and the input signal being applied to respective ones of the first and second transistors for causing them to be operated in antiphase. In one arrangement the output of the inverter means may be applied to the second transistor and switch means being provided for connecting the input signal to the gate electrode of the first transistor, the switch means conveniently taking the form of a third insulated gate field effect transistor connected between an input terminal and the gate electrode of the first transistor, the gate electrode of the third transistor being connected to one of the power supply terminals whereby in operation the third transistor is arranged to be normally conductive, and in another arrangement the output of the inverter means may be applied to the second transistor, further inverter means being provided to which an input signal is applied, the output of the further inverter means being applied to the input of the inverter means and the gate electrode of the first transistor.

In carrying out the invention according to the aforesaid one form of chip according to the present invention it may be arranged that delay means is provided, associated with the inverter means for effectively delaying the inverted input signal applied to the second transistor.

Conveniently the delay means may take the form of a capacitor connected between the input and output of the inverter means or may take the form of a capacitor connected between the input of the inverter means and one of the power supply terminals in which case a fourth insulated gate field effect transistor is preferably provided, connected in series with the input of the inverter means, the gate electrode of the fourth transistor being connected to one of the power supply terminals whereby in operation the fourth transistor is arranged to be normally conductive.

In an especially preferred form of the invention the buffer circuit will be provided with a main power supply terminal and an auxiliary power supply terminal both operable in conjunction with a common power supply terminal, the first and second transistors being connected in series between the common power supply terminal and the auxiliary power supply circuit and the remainder of the buffer circuit being connected between the common power supply terminal and the main power supply terminal.

In this way, by arranging that the voltage of the auxiliary power supply is greater than that of the main power supply, it may be arranged that the voltage swing of the output voltages will be greater than the voltage swing of the input signal with power only being consumed from the auxiliary power supply during transitions.

Some exemplary embodiments of the invention will now be described reference being made to the accompanying drawings, in which FIG. 1 is a partially block schematic diagram of a buffer circuit for inclusion on an electrical integrated circuit chip according to the present invention;

In the various Figures of the drawings, there are shown circuit diagrams of buffer circuits that may be fabricated on electrical integrated circuit chips that are produced using a process that does not enable complementary transistors to be used, i.e. all the transistors used in the buffer circuits are of the same kind and although in the embodiments to be described these are depicted as being metal-oxide-silicon (MOS) transistor, it should be appreciated that any similar form of insulated gate field effect transistor may be used. Also, in the embodiments to be described, so-called negative logic is used, but it should be appreciated that the principles described are equally applicable to so-called positive logic.

Figure 1:
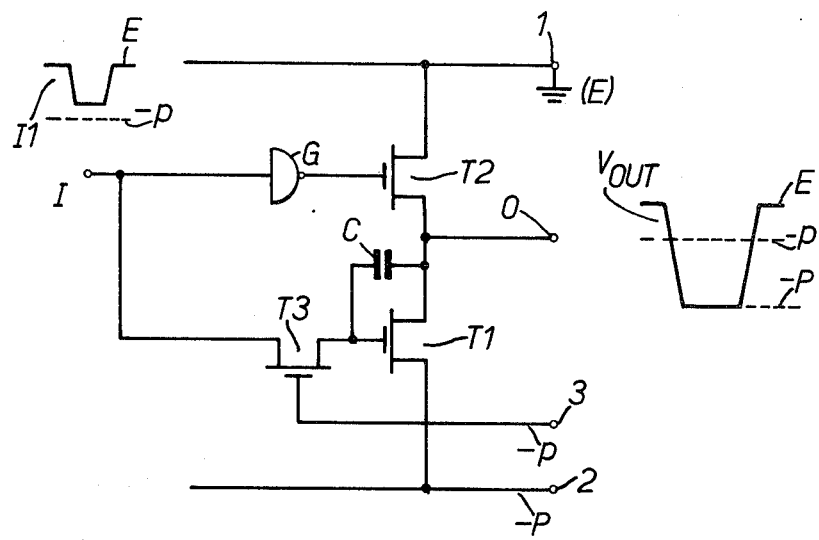

Considering the buffer circuit shown in FIG. 1 of the drawings, this consists of a first MOS transistor $T_1$ and a second MOS transistor $T_2$ which are connected in series between a common power supply terminal 1 which is normally earthed or grounded and an auxiliary power supply terminal 2, the voltage applied to which is assumed to be $-P$ volts. The junction of the transistors $T_1$ and $T_2$ is connected to an output terminal 0 which affords an output signal $V_o$. In operation of the buffer circuit, the transistors are arranged to be operated in anti-phase, this being achieved by means of an inverter circuit G which is connected between an input terminal I to which an input signal $I_1$ is applied and the gate electrode of transistor $T_2$, the gate electrode of transistor $T_1$ being connected without inversion to the input terminal I via an analogue gate formed by a further MOS transistor $T_3$ the function of which will be described later.

Considering the operation of the buffer circuit thus far described, with a logic '0' signal (i.e. zero volts) applied to the input I, due to the inverter G, the transistor $T_2$ is made to assume an 'ON' state and if it is assumed that the transistor $T_3$ is also 'ON' then the transistor $T_1$ is made to assume an 'OFF' state. In this condition, with the transistor $T_2$ 'ON' the voltage appearing at the output 0 will substantially correspond to the potential of the supply terminal 2 i.e. zero volts and will thus be at logic '0' as was the input signal.

If now a logic '1' signal i.e. a negative signal is applied to the input I, transistor $T_2$ will turn 'OFF' and transistor $T_1$ will turn 'ON'. In this condition the junction between the two transistors $T_1$ and $T_2$ will assume a potential which is a threshold voltage $V_t$ less than the gate voltage, this being due to the transistor $T_1$ being connected in this condition in source-follower configuration. Therefore the output $V_o$ will assume a voltage which is equal to the input voltage less the threshold voltage $V_t$.

In some applications it is required that the voltage swing of the output signal $V_o$ should be equal to or greater than that of the input I, and this is achieved in the arrangement shown in FIG. 1 by connecting a capacitor C in bootstrap configuration between the junction between the transistor $T_1$ and $T_2$ and the gate electrode of transistor $T_2$. In the arrangement of FIG. 1, it is required that the voltage swing of the output signal exceed that of the input signal and this is achieved by providing a main supply terminal 3 to which a voltage $-p$ is applied it being assumed that the voltage $-P$ applied to the auxiliary power supply terminal 2 is more negative than the voltage $-p$ applied to the main power supply terminal 3.

The operation of the circuit is then as follows.

With a logic '0' (zero volts) applied to the input I, due to the inverter G transistor $T_2$ is made to assume an 'ON' condition; because of the negative potential applied to the gate electrode of transistor $T_3$ which is connected to the main supply terminal 3 transistor $T_3$ is made to assume an 'ON' condition which causes transistor $T_1$ to assume an 'OFF' condition. With these conditions prevailing the output voltage appearing at output 0 will be at zero volts i.e. logic '0'.

When a logic '1' i.e. a negative voltage is applied to the input I, as the input potential initially goes negative, the above conditions are maintained and the negative going potential is applied via the 'ON' transistor $T_3$ to the gate electrode of transistor $T_1$ and causes the bootstrap capacitor to charge up from the input I. As the negative going potential increases when the threshold voltage of transistor $T_1$ is exceeded, transistor $T_1$ is caused to turn 'ON'. However, due to the transistor $T_2$ being already 'ON' only a small change in the potential of the output 0 is obtained. It is a fact, however, that whilst the two transistors $T_1$ and $T_2$ are both conducting power is consumed via the auxiliary power supply terminal 2. As the negative going potential applied to the input I increases, the capacitor C continues to charge until a point is reached where the potential applied to the input I gets to within a threshold voltage of the $-p$ potential applied to the main power supply terminal 3, at which time the transistor $T_3$ is caused to turn 'OFF' and, due to the inverter G, the transistor $T_2$ is caused to turn 'OFF'. Due to the transistor $T_2$ turning 'OFF' the potential at the junction between the transistors $T_1$ and $T_2$ goes negative and would normally assume a potential that is a threshold potential less than the potential on the gate electrode of transistor $T_1$. However, due to the charged bootstrap capacitor C, the negative going potential appearing at the output of 0 is transferred to the gate electrode of transistor $T_1$ which causes the transistor $T_1$ to be turned harder 'ON' and causes the potential of the output $V_o$ afforded at the junction of the transistors $T_1$ and $T_2$ to very nearly reach the potential $-P$ to which the transistor $T_1$ is connected. By arranging that the potential $-P$ of the auxiliary power supply applied to terminal 2 is greater than the potential $-p$ of the main power supply applied to the terminal 3, it can be arranged that the potential swing of the output voltage $V_o$ is greater than the potential swing applied to the input I.

When a logic '0' signal is again applied to the input I, the transistor $T_3$ and the transistor $T_2$ are again turned 'ON' which causes the capacitor C to be discharged and the transistor $T_1$ is turned 'OFF'.

Figure 2:
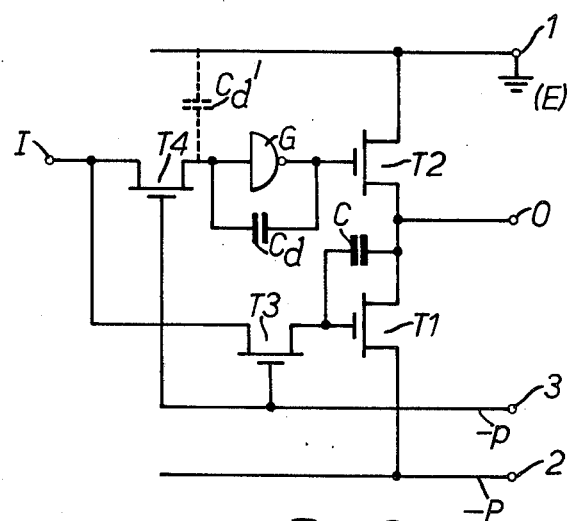
FIG. 2 is a partially block schematic diagram of an improved form of the buffer circuit of FIG. 1.

In practice it is found that when a logic '1' signal is applied to the input I, unless the output capacitance of the buffer circuit is considerably larger than the bootstrap capacitor C, insufficient time is provided during the transitional period between a logic '0' and a logic '1' being applied, to allow the bootstrap capacitor C to be charged. This is due to the transistor $T_2$ being turned 'ON' too early. This may be overcome by delaying the pulse applied to the transistor $T_2$, and this may conveniently be done as shown in FIG. 2 of the drawings, which reproduces the circuit diagram of FIG. 1, by connecting a capacitor $C_d$ in MILLER configuration between the output and input of the inverter G, or alternatively by connecting a shunt capacitor $C_d'$ in the input of the inverter G. In both of these arrangements it is found that the effectiveness of the delaying capacitor $C_d$ or $C_d'$ is enhanced by providing a further MOS transistor $T_4$ which is connected in series between the input terminal I and the input of the inverter G, the gate electrode of the transistor $T_4$ being connected to the $-p$ potential so that with a logic '0' signal applied to the input I the transistor $T_4$ is 'ON' and with a logic '1' signal applied it is 'OFF'.

Figure 3:
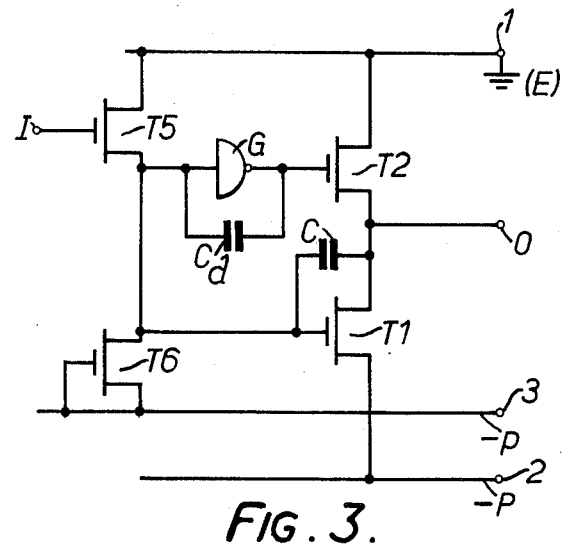
FIG. 3 is a partially block schematic diagram of a further improved form of the buffer circuit of FIG. 1.

In the buffer circuits of FIGS. 1 and 2, it is necessary, in order to ensure that the transistor $T_3$ is turned 'OFF' when a logic '1' signal is applied to the input I, to ensure that the logic '1' potential applied to the input I differs from the $-p$ potential applied to the main power supply terminal 3 by less than a threshold voltage. In some arrangements this may not be easily arranged and in FIG. 3 of the drawings there is shown a modification of the buffer circuit of FIG. 1 in which a small input voltage swing may be tolerated. The buffer circuit shown in FIG. 3 is basically the same as that of FIG. 1 and like elements have been accorded the same reference numerals, except that instead of the transistor $T_3$ being provided a further inverter consisting of MOS transistors $T_5$ and $T_6$ is provided. In the arrangement of FIG. 3, the transistor $T_5$ is connected as an inverting transistor with the transistor $T_6$ connected as its load, and the input I is connected to the gate electrode of the transistor $T_5$ and the junction of the two transistors $T_5$ and $T_6$ is connected to the input of the inverter G and to the gate electrode of transistor $T_1$. In the circuit of FIG. 3, the delay capacitor $C_d$ is shown but it should be appreciated that this may or may not be required or may be replaced by a shunt capacitor (not shown) corresponding to the capacitor $C_d'$ in FIG. 1.

In the buffer circuit of FIG. 3, if the output capacitance is sufficiently high such that no additional delaying capacitor $C_d$ or $C_d'$ is required then, since between the input I and the gate electrode of transistor $T_2$ there is effectively connected two inverters in series, then the inverter G may be dispensed with and the gate electrode of transistor $T_2$ may be connected directly to the input I.

Figure 4:
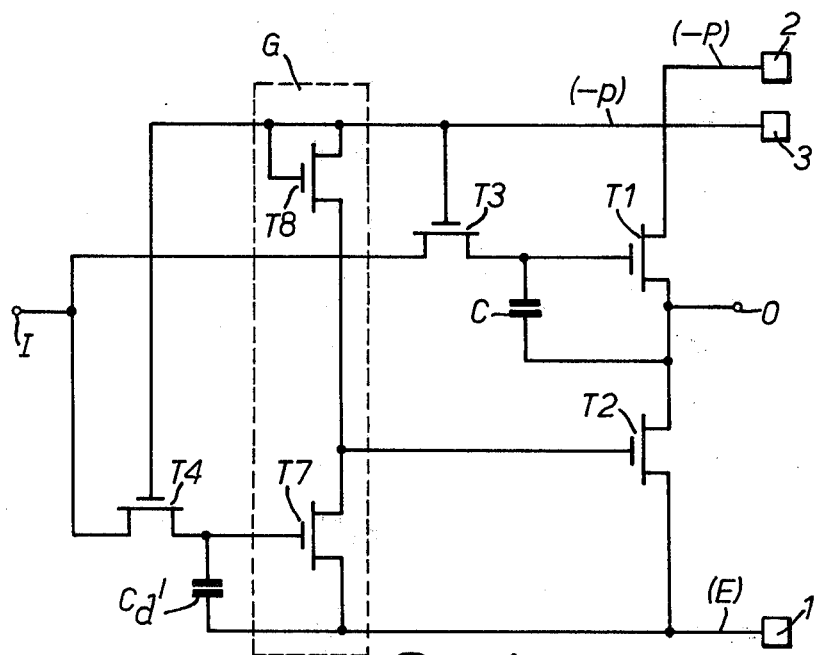
FIG. 4 is the circuit diagram of an especially preferred form of buffer circuit based on the circuit of FIG. 2.

In FIG. 4 of the drawings there is depicted the circuit diagram of the buffer circuit of FIG. 2 in which the inverter is shown as consisting of an inverting MOS transistor $T_7$ and a load MOS transistor $T_8$. The buffer circuit of FIG. 4 is admirably suitable for incorporation on an integrated circuit chip, the power supply terminals 1, 2 and 3 being shown as connecting pads.

In all of the embodiments thus far described it has been assumed that two power supplies have been available in order to obtain an output voltage swing which exceeds the maximum input voltage swing. However, the principles described are equally applicable to single power supply circuits which would enable an output voltage swing which was equal to the maximum input voltage to be obtained.

What we claim is:

1. An electrical integrated circuit chip including a buffer amplifier comprising a first pair of power supply terminals for receiving a supply voltage thereacross having a first level of magnitude, first and second insulated gate field effect transistors of the same channel conductivity, said transistors having source, drain and control electrodes, and being connected in series between the first pair of power supply terminals with the source of the first transistor connected to the drain of the second transistor, output terminal means connected to the source of the first transistor, a second pair of power supply terminals for receiving a supply voltage thereacross of a magnitude different from that across said first pair of power supply terminals input means for receiving a two-level input signal having a potential difference of a magnitude less than that received across either of said pairs of supply terminals, said input means being connected between the second pair of power supply terminals and being connected for applying said two-level signal to the control electrodes of the first and second transistors in antiphase to one another and bootstrap capacitor means connected between the output terminal means and the control electrode of the first transistor.

2. A chip as claimed in claim 1, in which the first transistor is arranged to be normally non-conductive and is connected to operate in source-follower configuration, and the second transistor is arranged to be normally conductive, the bootstrap capacitor means being connected between the junction of the first and second transistors and the gate electrode of the first transistor.

3. A chip as claimed in claim 1, wherein said input means includes inverter means to which the input signal to the circuit is applied, the output of the inverter means and the input signal being applied to respective ones of the first and second transistors for causing them to be operated in antiphase.

4. A chip as claimed in claim 3, in which the output of the inverter means is applied to the second transistor and in which switch means is provided for connecting the input signal to the gate electrode of the first transistor.

5. A chip as claimed in claim 4, in which the switch means takes the form of a third insulated gate field effect transistor connected between an input terminal and the gate electrode of the first transistor, the gate electrode of the third transistor being connected to one of the power supply terminals whereby in operation the third transistor is arranged to be normally conductive.

6. A chip as claimed in claim 4, in which delay means is provided, associated with the inverter means for effectively delaying the inverted input signal applied to the second transistor.

7. A chip as claimed in claim 6, in which the delay means takes the form of a capacitor connected between the input and output of the inverter means.

8. A chip as claimed in claim 7, in which a third insulated gate field effect transistor is provided, connected in series with the input of the inverter means, the gate electrode of the third transistor being connected to one of the power supply terminals whereby in operation the third transistor is arranged to be normally conductive.

9. A chip as claimed in claim 6, in which the delay means takes the form of a capacitor connected between the input of the inverter means and one of the power supply terminals.

10. A chip as claimed in claim 3, in which the output of the inverter means is applied to the second transistor, and in which further inverter means is provided to which an input signal is applied, the output of the further inverter means being applied to the input of the inverter means and the gate electrode of the first transistor.

11. An electrical integrated circuit chip including a buffer amplifier comprising a first pair of power supply terminals for receiving a supply voltage thereacross having a first level of magnitude, first and second insulated gate field effect transistors of the same channel conductivity, said transistors having source, drain and control electrodes and being connected in series between the first pair of power supply terminals with the source of the first transistor connected to the drain of the second transistor, output terminal means connected to the source of the first transistor, a second pair of power supply terminals for receiving a supply voltage thereacross of a magnitude different from that across said first pair of power supply terminals, input means connected between the second pair of power supply terminals said input means comprising an input terminal, third and fourth insulated gate field effect transistors of the same channel conductivity as the first and second transistors and having input, output and control electrodes in which the control electrodes of the third and fourth transistors are connected to a terminal of the second pair of power supply terminals, the input electrodes are connected to the input terminal, and the output electrode of the third transistor is connected to the control electrode of the first transistor; an inverter having an input terminal connected to the output electrode of the fourth transistor and an output electrode connected to the control electrode of the second transistor, delay means connected across the inverter and bootstrap capacitor means connected between the source and control electrodes of the first transistor.

12. An integrated circuit chip as claimed in claim 11, in which the inverter comprises fifth and sixth transistors connected in series between the second pair of power supply terminals with the sixth transistor connected as a load for the fifth transistor and the fifth transistor having a control electrode connected to the output electrode of the fourth transistor and an output electrode connected to the control electrode of the second transistor.

* * * * *